US010756034B2

(12) United States Patent
Huang et al.

(10) Patent No.: US 10,756,034 B2
(45) Date of Patent: Aug. 25, 2020

(54) DISPLAY SUBSTRATE, PRODUCTION METHOD THEREOF, AND DISPLAY APPARATUS

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Weiyun Huang, Beijing (CN); Haigang Qing, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

(*) Notice: Subject to any disclaimer, the term of this patent is extended or adjusted under 35 U.S.C. 154(b) by 35 days.

(21) Appl. No.: 16/092,721

(22) PCT Filed: Jan. 10, 2018

(86) PCT No.: PCT/CN2018/072071
§ 371 (c)(1),
(2) Date: Oct. 10, 2018

(87) PCT Pub. No.: WO2019/015270
PCT Pub. Date: Jan. 24, 2019

(65) Prior Publication Data
US 2019/0189573 A1 Jun. 20, 2019

(30) Foreign Application Priority Data

Jul. 17, 2017 (CN) .......................... 2017 1 0584603

(51) Int. Cl.
H01L 27/32 (2006.01)
H01L 27/12 (2006.01)
H01L 23/00 (2006.01)

(52) U.S. Cl.
CPC .............. *H01L 24/03* (2013.01); *H01L 24/05* (2013.01); *H01L 27/1244* (2013.01);
(Continued)

(58) Field of Classification Search
None
See application file for complete search history.

(56) References Cited

U.S. PATENT DOCUMENTS 7,659,625 B2   2/2010   Lim et al.
9,219,081 B2   12/2015  Nagasawa et al.
(Continued)

FOREIGN PATENT DOCUMENTS

CN   101645456 A   2/2010
CN   102496616 A   6/2012
(Continued)

OTHER PUBLICATIONS

International Search Report and Written Opinion with English Translation dated Apr. 3, 2018, received for corresponding PCT Application No. PCT/CN2018/072071.
(Continued)

Primary Examiner — Grant S Withers
(74) Attorney, Agent, or Firm — Kinney & Lange, P.A.

(57) ABSTRACT

This disclosure provides a display substrate, a production method thereof, and a display apparatus. The display substrate comprises: a display area; and a pad area outside the display area. The pad area comprises at least one pad. The pad comprises: a metal layer, which comprises a first metal sublayer and a second metal sublayer laminated on the first metal sublayer, wherein a corrosion resistance of the second
(Continued)

metal sublayer is stronger than that of the first metal sublayer; and a conductive material layer, which covers a side surface of the metal layer.

5 Claims, 4 Drawing Sheets

(52) U.S. Cl.
CPC .......... *H01L 27/1288* (2013.01); *H01L 27/32* (2013.01); *H01L 27/3276* (2013.01); *H01L 27/3279* (2013.01); *H01L 24/29* (2013.01); *H01L 24/32* (2013.01); *H01L 27/3246* (2013.01); *H01L 27/3283* (2013.01); *H01L 2224/03019* (2013.01); *H01L 2224/03622* (2013.01); *H01L 2224/05083* (2013.01); *H01L 2224/05124* (2013.01); *H01L 2224/05166* (2013.01); *H01L 2224/05565* (2013.01); *H01L 2224/05583* (2013.01); *H01L 2224/05639* (2013.01); *H01L 2224/05687* (2013.01); *H01L 2224/29344* (2013.01); *H01L 2224/32227* (2013.01)

(56) References Cited

U.S. PATENT DOCUMENTS

| | | | |
|---|---|---|---|
| 9,281,349 | B2 | 3/2016 | Park et al. |
| 9,299,750 | B2 | 3/2016 | Lim et al. |
| 9,548,346 | B2 | 1/2017 | Nagasawa et al. |
| 9,712,651 | B2 | 7/2017 | Nagasawa et al. |
| 10,032,844 | B2 | 7/2018 | Kim et al. |
| 10,083,924 | B2 | 9/2018 | Maekawa et al. |
| 10,181,573 | B2 | 1/2019 | Im et al. |
| 10,341,475 | B2 | 7/2019 | Nagasawa et al. |
| 10,529,790 | B2 | 1/2020 | Park et al. |
| 2001/0009283 | A1 | 7/2001 | Arao et al. |
| 2004/0080688 | A1 | 4/2004 | Ishida |
| 2006/0028606 | A1 | 2/2006 | Takeguchi et al. |
| 2011/0234964 | A1* | 9/2011 | Moriwaki ......... G02F 1/136204 349/149 |
| 2011/0316013 | A1* | 12/2011 | Boerner ................. B82Y 20/00 257/88 |
| 2014/0184937 | A1 | 7/2014 | Lim et al. |
| 2014/0209914 | A1 | 7/2014 | Nagasawa et al. |
| 2014/0353620 | A1 | 12/2014 | Park et al. |
| 2016/0013436 | A1 | 1/2016 | Im et al. |
| 2016/0035815 | A1 | 2/2016 | Nagasawa et al. |
| 2016/0190225 | A1* | 6/2016 | Kim .................... H01L 27/3276 257/40 |
| 2016/0218165 | A1 | 7/2016 | Park et al. |
| 2016/0379946 | A1 | 12/2016 | Maekawa et al. |
| 2017/0104857 | A1 | 4/2017 | Nagasawa et al. |
| 2017/0141176 | A1 | 5/2017 | Im et al. |
| 2017/0289325 | A1 | 10/2017 | Nagasawa et al. |
| 2018/0151828 | A1* | 5/2018 | Im ....................... G09G 3/3208 |
| 2018/0191880 | A1 | 7/2018 | Nagasawa et al. |
| 2018/0323249 | A1 | 11/2018 | Kim et al. |
| 2019/0097161 | A1 | 3/2019 | Im et al. |

FOREIGN PATENT DOCUMENTS

| | | |
|---|---|---|
| CN | 104218058 A | 12/2014 |
| CN | 105261633 A | 1/2016 |
| CN | 105742324 A | 7/2016 |
| CN | 105793964 A | 7/2016 |
| CN | 106952929 A | 7/2017 |
| KR | 20160014259 A | 2/2016 |
| KR | 20160091529 A | 8/2016 |

OTHER PUBLICATIONS

Extended European Search Report dated Feb. 12, 2020 received for corresponding Chinese PCT Application No. PCT/CN2018/072071, 8 pages.
First Chinese Office Action dated Mar. 4, 2020, received for corresponding Chinese Application No. 201710584603.4, 13 pages.
First Indian Office Action dated Apr. 29, 2020, received for corresponding Indian Application No. 201847041148, 7 pages.

* cited by examiner

US 10,756,034 B2

DISPLAY SUBSTRATE, PRODUCTION METHOD THEREOF, AND DISPLAY APPARATUS

CROSS-REFERENCE TO RELATED APPLICATION(S)

This application is the national phase of PCT Application No. PCT/CN2018/072071 filed on Jan. 10, 2018, which in turn claims the priority of Chinese Patent Application No. 201710584603.4 filed on Jul. 17, 2017, the entire contents of which are incorporated herein by reference.

TECHNICAL FIELD

This disclosure relates to the technical field of light-emitting display, and more particularly to a display substrate, a production method thereof, and a display apparatus.

BACKGROUND

A pad used for a display apparatus comprises a metal sublayer with a relatively weak corrosion resistance, which is revealed at an edge of the pad, and the revealed metal sublayer may be damaged and thereby the pad and the display apparatus are impaired when an electrode etching process is subjected to an electrode in a display area.

In order to prevent the occurrence of the problem described above, the edge of the pad is typically covered with a pixel defining layer material such as polyimide or poly(methyl methacrylate). However, since the pixel defining layer is typically thick, the pixel defining layer covering the pad area is required to be thinned in order not to influence the quality of welding. This thinning is required to be performed by using a half-tone mask, then depositing a conductive material layer, and etching the conductive material layer, and thus the cost increases and the process becomes complex.

SUMMARY

In one aspect of this disclosure, there is provided a display substrate, comprising:
a display area; and
a pad area outside the display area,
wherein the pad area comprises at least one pad, which comprises:
a metal layer, which comprises a first metal sublayer and a second metal sublayer laminated on the first metal sublayer, wherein a corrosion resistance of the second metal sublayer is stronger than that of the first metal sublayer; and
a conductive material layer, which covers a side surface of the metal layer.

According to another embodiment of this disclosure, the display area comprises a display electrode, wherein the conductive material layer of the pad and the display electrode of the display area are provided in the same layer.

According to another embodiment of this disclosure, the display electrode comprises an anode, wherein the conductive material layer of the pad and the anode are provided in the same layer.

According to another embodiment of this disclosure, the display area comprises a transistor, which comprises a source electrode and a drain electrode, wherein the metal layer of the pad and the source electrode and drain electrode of the display area are provided in the same layer.

According to another embodiment of this disclosure, the first metal sublayer comprises aluminum, and the second metal sublayer comprises titanium.

According to another embodiment of this disclosure, the metal layer further comprises a third metal sublayer, wherein the first metal sublayer is laminated on the third metal sublayer, and a corrosion resistance of the third metal sublayer is stronger than that of the first metal sublayer.

According to another embodiment of this disclosure, the first metal sublayer comprises aluminum, and each of the second metal sublayer and the third metal sublayer comprises titanium.

According to another embodiment of this disclosure, the conductive material layer is a multilayer structure comprising a first transparent conductive oxide layer, a metal material layer, and a second transparent conductive oxide layer.

According to another embodiment of this disclosure, the first or second transparent conductive oxide layer comprises any one of the group consisting of indium oxide, tin oxide, indium tin oxide, and a mixture of any two or more thereof.

According to another embodiment of this disclosure, the metal material layer comprises silver.

According to another embodiment of this disclosure, the first or second transparent conductive oxide layer comprises indium tin oxide, and the metal material layer comprises silver.

According to another embodiment of this disclosure, the pad further comprises an anisotropic conductive adhesive comprising gold beads, wherein the second metal sublayer is in contact with the anisotropic conductive adhesive comprising gold beads.

In another aspect of this disclosure, there is provided a display apparatus, comprising the display substrate of any one described above.

In still another aspect of this disclosure, there is provided a method for producing a display substrate comprising a display area and a pad area outside the display area, wherein the method comprises the steps of:
forming a metal layer on the pad area, which comprises a first metal sublayer and a second metal sublayer laminated on the first metal sublayer, wherein a corrosion resistance of the second metal sublayer is stronger than that of the first metal sublayer; and
forming a conductive material layer, which covers a side surface of the metal layer.

According to one embodiment of this disclosure, forming the conductive material layer comprises:
forming a pre-formed conductive material layer, which at least covers a top surface and a side surface of the metal layer;
coating a photoresist on the pre-formed conductive material layer;
performing exposure and development on the photoresist with a mask to uncover a part of the pre-formed conductive material layer, wherein after the development the photoresist of the pre-formed conductive material layer covering the side surface of the metal layer is at least retained, and the photoresist of pre-formed conductive material layer covering a part of the top surface of the metal layer is at least removed;
etching a part of the pre-formed conductive material layer that has been uncovered; and
removing the remaining photoresist.

According to one embodiment of this disclosure, the method further comprises the step of: further retaining the photoresist covering a part of the pre-formed conductive material layer in the display area after the development, so as to form a display electrode in the part of the pre-formed conductive material layer in the display area after removing the remaining photoresist.

According to another embodiment of this disclosure, the display electrode comprises an anode, and the conductive material layer of the pad area and the anode of the display area are formed simultaneously.

According to another embodiment of this disclosure, the display area further comprises a source electrode and a drain electrode, and the metal layer of the pad area and the source electrode and drain electrode of the display area are formed simultaneously.

According to another embodiment of this disclosure, the method further comprises: forming an anisotropic conductive adhesive comprising gold beads on the second metal sublayer after etching the part of the pre-formed conductive material layer that has been uncovered.

BRIEF DESCRIPTION OF DRAWINGS

In order to illustrate the technical solutions in examples of this disclosure more clearly, figures required for describing the examples will be simply introduced below. It is apparent that the figures described below are merely exemplary examples of this disclosure, and other figures may be further obtained by those of ordinary skill in the art according to these figures without exerting inventive work.

FIGS. 3A-3E are sectional views schematically illustrating a display substrate after respective process steps of a method for producing a display substrate according to one embodiment of this disclosure, wherein FIG. 3A is a sectional view after a step of coating a photoresist; FIG. 3B a sectional view of a step of covering the photoresist with a mask; FIG. 3C is a sectional view of a step of uncovering a part of a pre-formed conductive material layer after exposure and development; FIG. 3D is a sectional view of a step of etching the pre-formed conductive material layer; and FIG. 3E is a sectional view of a step of removing the photoresist.

DETAILED DESCRIPTION OF EMBODIMENTS

Figure 1:
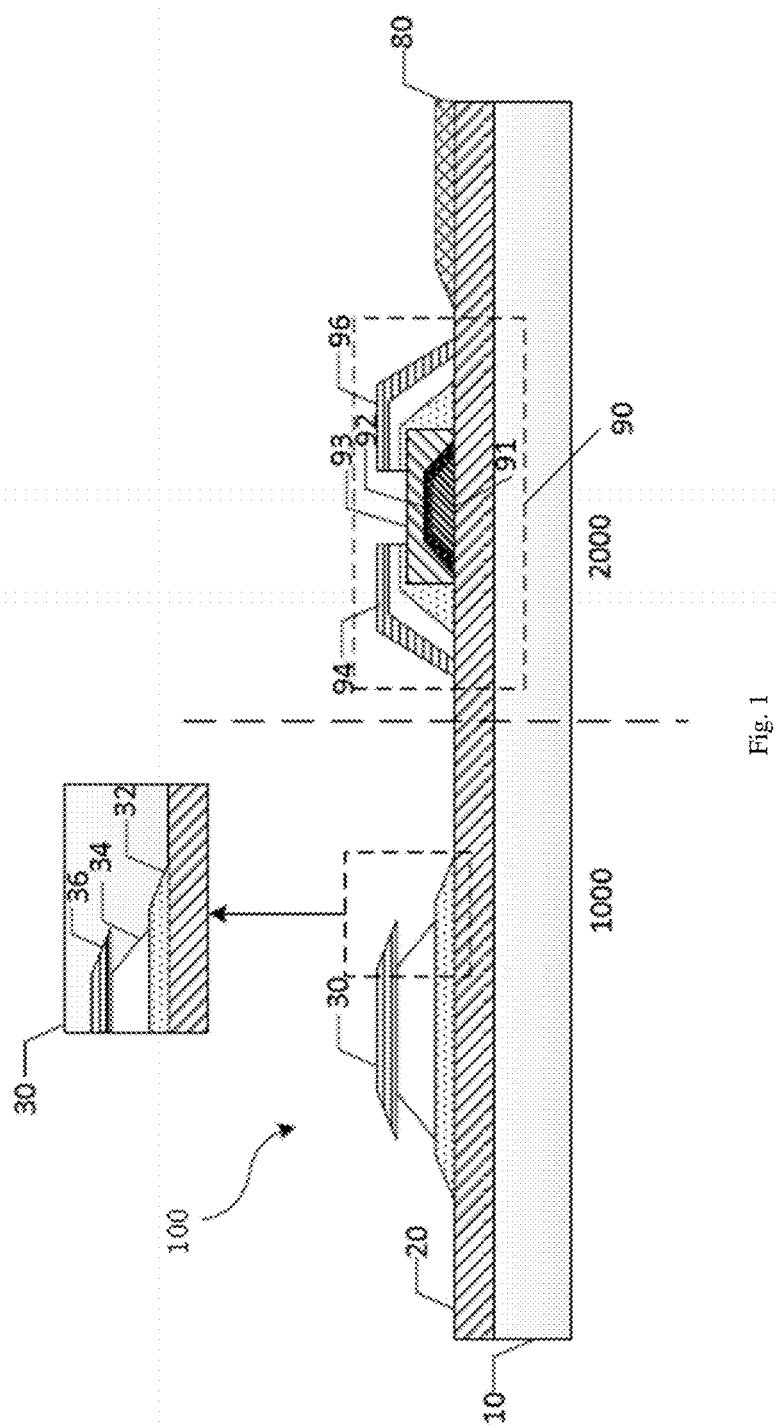
FIG. 1 is a sectional view schematically illustrating a metal layer of a pad of a display substrate after etching without protection.

The technical solutions in the examples of this disclosure will be described clearly and fully below in conjunction with specific embodiments of this disclosure. Obviously, the embodiments and/or examples described are merely a part of the embodiments and/or examples of this disclosure, rather than all of the embodiments and/or examples. Based on the embodiments and/or examples of this disclosure, all other embodiments and/or examples obtained by those of ordinary skill in the art without performing inventive work belong to the scope protected by this disclosure.

In this disclosure, the layer or the film may be interchangeably used; and the pad is also referred to as a bonding pad sometimes, unless specifically indicated. Terms "first", "second", and "third" are for the purpose of description only, and cannot be understood as indicating or suggesting relative importance or implying the number of technical features indicated. Thereby, a characteristic defined by "first", "second", or "third" may expressly or impliedly comprises one or more characteristics.

A pad used for a display apparatus typically comprises a metal layer. The metal layer typically comprises a first metal sublayer and a second metal sublayer laminated on the first metal sublayer, wherein a corrosion resistance of the first metal sublayer is weaker than that of the second metal sublayer. For example, the metal layer is a multilayer structure comprising a first conductive metal sublayer with a relatively weak corrosion resistance, a second metal sublayer thereon with a relatively strong corrosion resistance for resisting corrosion, and a third metal sublayer therebelow with a relatively strong corrosion resistance for enhancing the bondability to a substrate, for example a multilayer structure of a titanium layer, an aluminum layer, and a titanium layer. When the electrode in the display area was subjected to an electrode etching process, it will lead to the undercutting of the first metal sublayer with a relatively weak corrosion resistance, such as an aluminum layer, in the pad in the pad area, so that this multilayer structure is very instable. For example, the second metal sublayer with a relatively strong corrosion resistance, such as a titanium layer, will collapse in following processes and become mobile conductive particles, which will lead to short circuit occurred between different signal lines.

In view of one or more problems in the related art, this disclosure provides a display substrate, a production method thereof, and a display apparatus, which may prevent the undercutting of the first metal sublayer with a relatively weak corrosion resistance such as an aluminum layer, so as to prevent the problem that the second metal sublayer with a relatively strong corrosion resistance, such as a titanium layer, collapses in following processes and becomes mobile conductive particles which leads to short circuit occurred between different signal lines. In some examples, the production method of the display substrate of this disclosure will not add process steps or increase the cost.

In one aspect of this disclosure, there may be provided a display substrate. The display substrate comprises: a display area; and a pad area outside the display area. The pad area comprises at least one pad. The pad comprises: a metal layer and a conductive material layer. The metal layer comprises a first metal sublayer and a second metal sublayer laminated on the first metal sublayer. The corrosion resistance of the second metal sublayer is stronger than that of the first metal sublayer. The conductive material layer covers a side surface of the metal layer.

According to one embodiment of this disclosure, the display area may comprise a display electrode. The conductive material layer of the pad and the display electrode of the display area are provided in the same layer.

According to another embodiment of this disclosure, the display electrode comprises an anode, wherein the conductive material layer of the pad and the anode are provided in the same layer.

According to another embodiment of this disclosure, the display area further comprises a source electrode and a drain electrode, wherein the metal layer of the pad and the source electrode and drain electrode of the display area are provided in the same layer.

Hereinafter, in order to illustrate this disclosure, description is made by exemplifying the circumstances below and in conjunction with accompanying drawings. However, this disclosure is not limited thereto. The metal layer is a layer formed in the same layer as those of the source electrode and the drain electrode of the transistor in the display substrate, and is a three-layer structure comprising a titanium layer, an aluminum layer, and a titanium layer; the display electrode is an anode; the conductive material layer is an anode material layer formed in the same layer and by the same patterning process as those of the anode; and each of the conductive material layer and the anode is a three-layer structures comprising an ITO layer, a silver layer, and an ITO layer. For example, the transistor may be a thin-film transistor (TFT). In an alternative example, the metal layer may be a double-layer structure comprising an aluminum layer and a titanium layer covering the aluminum layer. In an alternative example, the display electrode may also be a cathode, and conductive material layer may also employ the same material as that of the cathode to be formed in the same layer and by the same patterning process.

Therefore, in the description below, the metal layer is also referred to as a source electrode and drain electrode metal layer sometimes, the conductive material layer is also referred to as an anode material layer sometimes, and the display electrode is also referred to as an anode sometimes.

In a typical production process of a display substrate, when an electrode in the display area is subjected to an electrode etching process, a non-corrosion-resistant part in a metal layer which has been formed in a pad area will be corroded. FIG. 1 is a sectional view schematically illustrating a metal layer of a pad 100 of a display substrate after subjecting an anode in a display area to an etching process without protection.

As shown in FIG. 1, the display substrate may comprise a pad area 1000 and a display area 2000 outside the pad area 1000. The pad area 1000 may comprise at least one pad 100. The pad 100 may comprise a base substrate 10, an insulating layer 20 formed on the base substrate 10, and a metal layer 30 (a three-sublayer structure, which may correspond to source electrode and drain electrode metal layers 94 and 96 in the display area 2000 described below, wherein the same sublayer is represented by the same legend) on the insulating layer 20. The display area 2000 may comprise a thin-film transistor (TFT) 90 on the insulating layer 20 and a display electrode 80 such as an anode 80. For example, the display electrode may be a pixel electrode. The TFT 90 may comprise a gate electrode 91, an interlayer dielectric layer 92, an active layer 93, a source electrode 94, and a drain electrode 96. The source electrode 94 or the drain electrode 96 may be connected to the display electrode 80 such as the anode 80. The drain electrode 96 may be connected to the anode 80. The metal layer 30 may be a multilayer structure comprising a third metal sublayer 32 with a relatively strong corrosion resistance, a first metal sublayer 34 with a relatively weak corrosion resistance, and a second metal sublayer 36 with a relatively strong corrosion resistance, for example a multilayer structure of a first titanium layer 32, an aluminum layer 34, and a second titanium layer 36. The first metal sublayer 34 is located between the third metal sublayer 32 and the second metal sublayer 36. In the pad 100, after the anode of the display apparatus is subjected to an etching process, it will lead to the undercutting of the intermediate first metal sublayer such as the aluminum layer 34, so that this multilayer structure is very instable. For example, the upper second metal sublayer 36 such as the second titanium layer 36 will collapse in following processes and become mobile conductive particles, which will lead to short circuit occurred between different signal lines.

Figure 2:
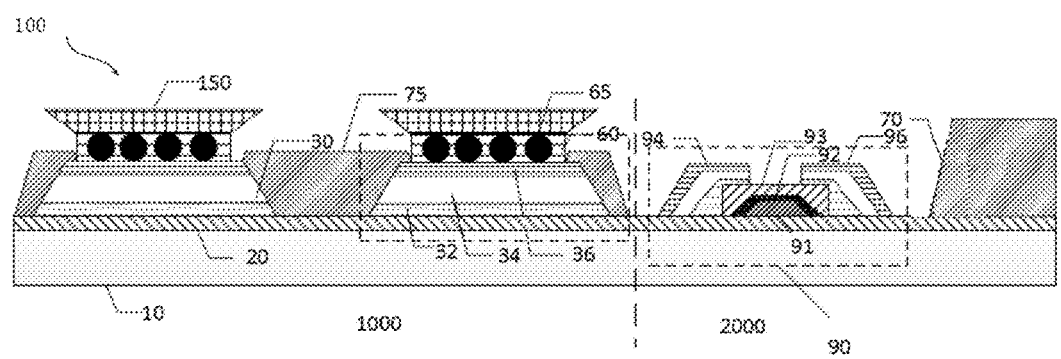
FIG. 2 is a sectional view schematically illustrating a display substrate when an edge of a pad is being covered with a pixel defining layer material such as polyimide or poly(methyl methacrylate).

FIG. 2 is a sectional view schematically illustrating a display substrate when an edge of a pad 100 is being covered with a pixel defining layer material such as polyimide or poly(methyl methacrylate). The same members as those in FIG. 1 are represented the same reference numerals; and detailed descriptions thereof are not made hereby.

In order to prevent the occurrence of the problem in conjunction with FIG. 1, the edge of the pad 100 is covered with a pixel defining layer material such as polyimide or poly(methyl methacrylate). However, since the pixel defining layer 70 is typically thick, the pixel defining layer covering the pad area 1000 is required to be thinned in order not to influence the quality of welding, so that a thinned pixel defining layer 75 is formed. This thinning is required to be performed by using a half-tone mask, for example, and the process becomes complex. 150, 65, and 60 in the figure represent a pad of another circuit board, such as a flexible printed circuit board (FPC), gold beads, and an anisotropic conductive adhesive, respectively.

Figure 3:
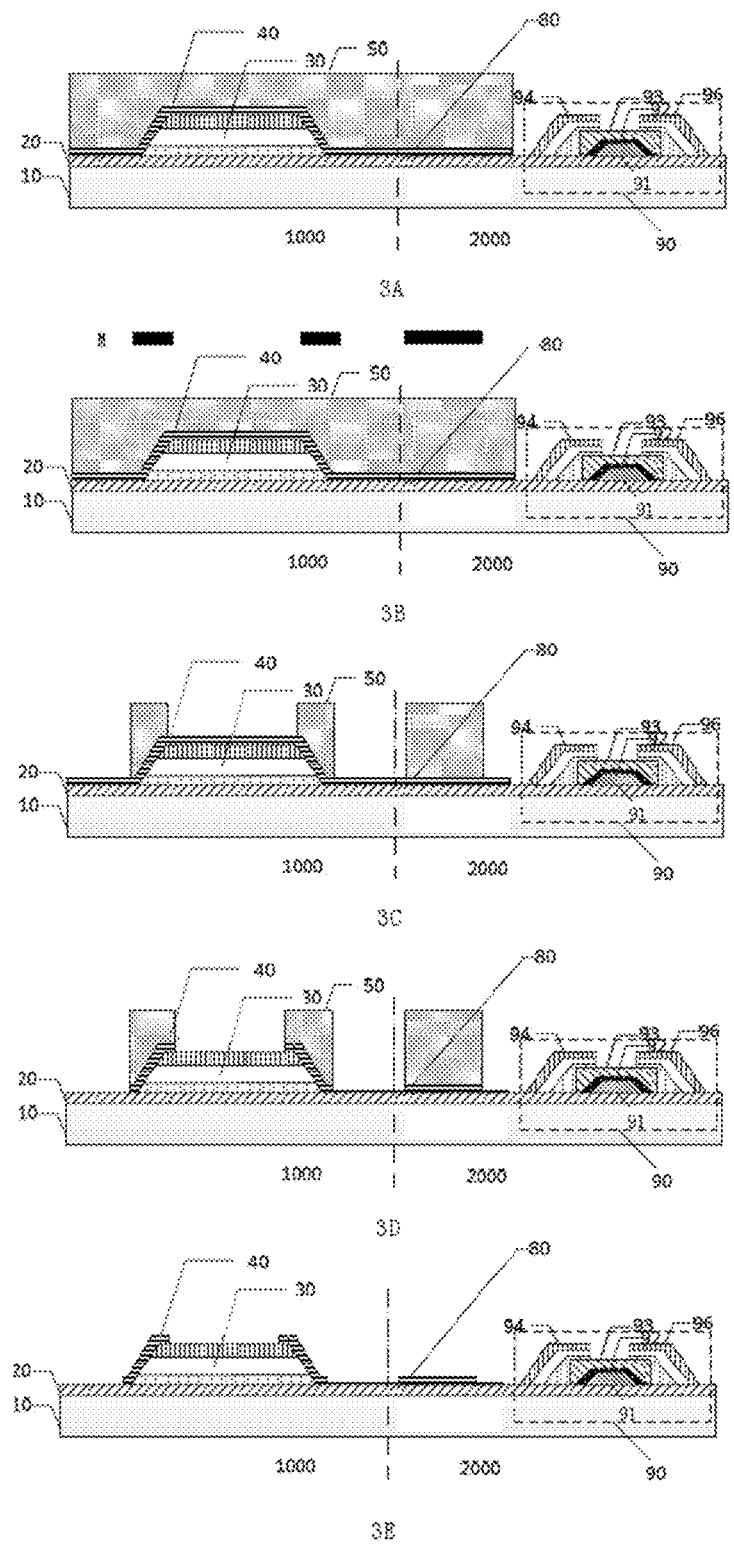

FIGS. 3A-3E are sectional views schematically illustrating a display substrate after respective process steps of a method for producing a display substrate according to one embodiment of this disclosure, wherein FIG. 3A is a sectional view after a step of coating a photoresist 50; FIG. 3B a sectional view of a step of covering the photoresist with a mask; FIG. 3C is a sectional view of a step of uncovering a part of a pre-formed conductive material layer after exposure and development; FIG. 3D is a sectional view of a step of etching the pre-formed conductive material layer; and FIG. 3E is a sectional view of a step of removing the photoresist 50. The same members as those in FIGS. 1 and 2 are represented the same reference numerals; and detailed descriptions thereof are not made hereby.

An embodiment of the method of this disclosure is first illustrated by using a pad area 1000 on the left side in FIGS. 3A-3E.

As shown in FIG. 3A, the method for producing a display substrate of this disclosure comprises the steps of:

forming a metal layer 30 on a pad area 1000, wherein the metal layer 30 comprises a first metal sublayer 34 and a second metal sublayer 36 laminated on the first metal sublayer 34, and wherein a corrosion resistance of the second metal sublayer 36 is stronger than that of the first metal sublayer 34;

forming a pre-formed conductive material layer 40 on the second metal sublayer 36; and coating a photoresist 50 on the pre-formed conductive material layer 40.

As shown in FIG. 3B, a mask M is subsequently used to shield the photoresist 50. The shielded part is a part of the pre-formed conductive material layer which is undesired to be etched off. In the figure, it is above a side surface of the metal layer 30, i.e., a conductive material layer 40 desired to be retained on the side surface of the metal layer 30.

As shown in FIG. 3C, exposure and development is subsequently performed to uncover a part of the pre-formed conductive material layer 40, wherein the photoresist 50 of the pre-formed conductive material layer 40 covering the side surface of the metal layer 30 is at least retained after the development, and the photoresist of pre-formed conductive material layer covering a part of the top surface of the metal layer is at least removed.

As shown in FIG. 3D, the pre-formed conductive material layer 40 is subsequently etched. The part of the conductive material covered by the photoresist is retained, and other parts are etched off.

As shown in FIG. 3E, the remaining photoresist 50 is subsequently removed.

The method of this disclosure may be in conjunction with production processes of other members of the display substrate. FIGS. 3A-3E also schematically show an embodiment of a production method comprising other members.

Description is now made in conjunction with a display area 2000 on the right side in the figures.

The display area 2000 may comprise a display electrode 80. The conductive material layer 40 of the pad area 1000 and the display electrode 80 of the display area 2000 may be formed simultaneously. That is, they are formed in the same layer and formed by using the same patterning process. As shown in FIG. 3A, the pre-formed conductive material layer 40 extends to a part in the display area 2000 where the display electrode 80 is to be formed. Although the pre-formed conductive material layers in the pad area 1000 and the display area 2000 are continuous as shown hereby, they may also be discontinuous. They may be formed in the same layer in one step such as a step of deposition, but they may also be formed separately. As shown in FIG. 3B, a mask is also provided above the photoresist 50 at the display electrode. As shown in FIG. 3C, exposure and development are performed to retain the photoresist on the side surface of the metal layer 30 and the photoresist at the display electrode 80. As shown in FIG. 3D, the redundant pre-formed conductive material layer is removed by etching, and the conductive material layer 40 on the side surface of the metal layer 30 and the conductive material at the display electrode 80 are retained. As shown in FIG. 3E, the remaining photoresist 50 is removed, and the display electrode 80 is formed while the conductive material layer 40 covering the side surface of the metal layer 30 is formed.

The display electrode may comprise an anode 80. The conductive material layer 40 of the pad area 1000 and the anode 80 of the display area 2000 may be formed simultaneously. That is, they are formed in the same layer and formed by using the same patterning process. As shown in FIG. 3A, the pre-formed conductive material layer 40 extends to a part in the display area 2000 where the anode 80 is to be formed. Although the pre-formed conductive material layers in the pad area 1000 and the display area 2000 are continuous as shown hereby, they may also be discontinuous. They may be formed in the same layer in one step such as a step of deposition, but they may also be formed separately. As shown in FIG. 3B, a mask is also provided above the photoresist 50 at the anode 80. As shown in FIG. 3C, exposure and development are performed to retain the photoresist on the side surface of the metal layer 30 and the photoresist at the anode 80. As shown in FIG. 3D, the redundant pre-formed conductive material layer is removed by etching, and the conductive material layer 40 on the side surface of the metal layer 30 and the conductive material at the anode 80 are retained. As shown in FIG. 3E, the remaining photoresist 50 is removed, and the anode 80 is formed while the conductive material layer 40 covering the side surface of the metal layer 30 is formed.

Previously, the metal layer 30 of the pad area 1000 and the source electrode and the drain electrode in the transistor of the display area 2000 may be formed simultaneously. That is, they are formed in the same layer and formed by using the same patterning process.

In this way, the undercutting of the first metal sublayer such as the aluminum layer 34 may be prevented when the anode is subjected to an etching process, so as to prevent problem that the second metal sublayer such as the second titanium layer 36 collapses in following processes and becomes mobile conductive particles which leads to short circuit occurred between different signal lines. Furthermore, the anode material layer 40 covering the side surface of the metal layer 30 also belongs to a conductive contact area, and may further improve the conductivity of the metal layer 30.

Figure 4:
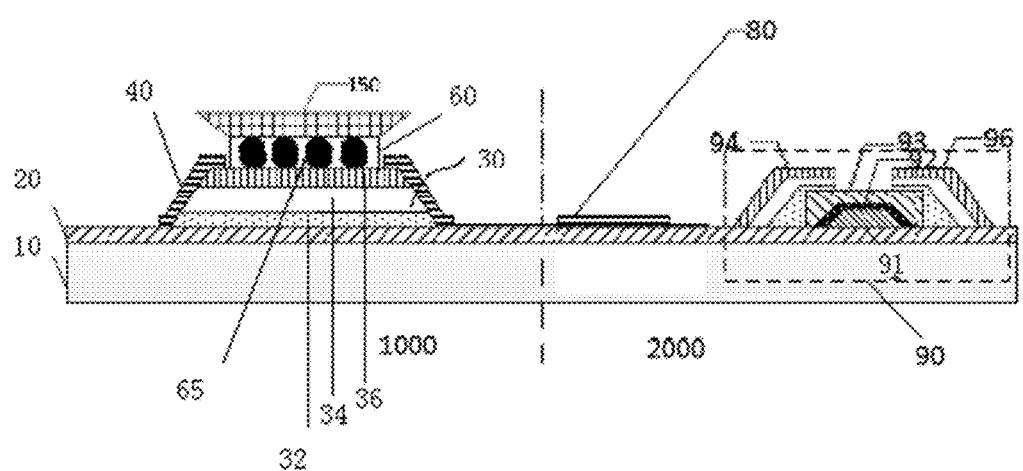
FIG. 4 is a sectional view schematically illustrating a display substrate according to one embodiment of this disclosure.

FIG. 4 is a sectional view schematically illustrating a display substrate according to one embodiment of this disclosure.

As shown in FIG. 4, the display substrate of this disclosure may comprise a pad area 1000 and a display area 2000 outside the pad area 1000. The pad area 1000 may comprise at least one pad 100. The pad 100 may comprise a base substrate 10, an insulating layer 20 formed on the base substrate 10, and a metal layer 30 on the insulating layer 20. Optionally, the display area 2000 may comprise a TFT 90 on the insulating layer 20 and a display electrode 80 such as an anode 80. The TFT 90 may comprise a gate electrode 91, an interlayer dielectric layer 92, an active layer 93, a source electrode 94, and a drain electrode 96. The source electrode 94 or the drain electrode 96 may be connected to the display electrode 80 such as the anode 80. The drain electrode 96 may be connected to the anode 80. The metal layer 30 may be a multilayer structure comprising a third metal sublayer 32 with a relatively strong corrosion resistance, a first metal sublayer 34 with a relatively weak corrosion resistance, and a second metal sublayer 36 with a relatively strong corrosion resistance, for example a multilayer structure of a first titanium layer 32, an aluminum layer 34, and a second titanium layer 36. The first metal sublayer 34 is located between the third metal sublayer 32 and the second metal sublayer 36.

Although a three-layer structure of a first titanium layer 32, an aluminum layer 34, and a second titanium layer 36 is shown in FIG. 4, it is to be understood by the person skilled in the art that the metal layer 30 may also be a double-layer structure only comprising a first metal sublayer 34 with a relatively weak corrosion resistance and a second metal sublayer 36 with a relatively strong corrosion resistance. The second metal sublayer 36 covers the first metal sublayer 34. For example, the metal layer 30 may be a double-layer structure of an aluminum layer 34 and a titanium layer 36. The titanium layer 36 covers the aluminum layer 34.

As shown in FIG. 4, a side surface of the metal layer 30 is covered by the anode material layer 40. In this way, the undercutting of the first metal sublayer such as the aluminum layer 34 may be prevented when the anode is subjected to an etching process, so as to prevent problem that the second metal sublayer such as the second titanium layer 36 collapses in following processes and becomes mobile conductive particles which leads to short circuit occurred between different signal lines. Furthermore, the anode material layer 40 covering the side surface of the metal layer 30 also belongs to a conductive contact area, and may further improve the conductivity of the metal layer 30.

According to one embodiment of this disclosure, the metal layer 30 may be a multilayer structure comprising a first titanium layer 32, an aluminum layer 34, and a second titanium layer 36. The aluminum layer 34 is located between the first titanium layer 32 and the second titanium layer 36. The thickness of the first titanium layer 32 may be 400 to 1000 Å. The thickness of the aluminum layer 34 may be 4000 to 8000 Å. The thickness of the second titanium layer may be 400 to 1000 Å. The thicknesses of the first titanium layer 32 and the second titanium layer 36 may the same or different.

According to one embodiment of this disclosure, in the case that the metal layer 30 is a double-layer structure of an aluminum layer 34 and a titanium layer 36, the thickness of the titanium layer 36 may be 400 to 1000 Å, and the thickness of the aluminum layer 34 may be 4000 to 8000 Å.

According to another embodiment of this disclosure, the anode material layer 40 may be a multilayer structure comprising a first transparent conductive oxide layer, a metal material layer, and a second transparent conductive oxide layer. The metal material layer is located between the first transparent conductive oxide layer and the second transparent conductive oxide layer. The thickness of the first transparent conductive oxide layer may be 50 to 100 Å. The thickness of the metal material layer may be 800 to 2000 Å. The thickness of the second transparent conductive oxide layer may be 50 to 100 Å. The thicknesses of the first transparent conductive oxide layer and the second transparent conductive oxide layer may the same or different.

According to another embodiment of this disclosure, the transparent conductive oxides in the first and second transparent conductive oxide layers may be the same or different, and the first and second transparent conductive oxide layers may comprise any one of the group consisting of indium oxide, tin oxide, indium tin oxide, and a mixture of any two or more thereof.

According to another embodiment of this disclosure, the metal material layer may comprise silver, and for example, is silver. For example, the anode material layer may comprise a first indium tin oxide (ITO) layer, a silver layer, and a second indium tin oxide (ITO) layer. The silver layer is located between the first ITO layer and the second ITO layer.

According to another embodiment of this disclosure, the display substrate may be an active-matrix light-emitting substrate or a passive-matrix light-emitting substrate.

According to another embodiment of this disclosure, the pad 100 may also be bonded to a pad 150 of another circuit board by an anisotropic conductive adhesive 60 comprising gold beads 65 on the second metal sublayer 36. The second metal sublayer 36 is in contact with the anisotropic conductive adhesive 60 comprising gold beads 65.

The pad of this disclosure may be used to be connected to an integrated circuit board or a flexible printed circuit board, for example electrically connected to a pad 150 of an integrated circuit board or a flexible printed circuit board.

According to another embodiment of this disclosure, the display area comprises a display electrode 80. The conductive material layer 40 of the pad 100 and the display electrode 80 of the display area are provided in the same layer and formed by the same patterning process. In this way, the conductive material layer 40 of the pad 100 may be formed without adding process steps or increasing the cost.

According to another embodiment of this disclosure, the display electrode comprises an anode 80. The anode material layer 40 of the pad and the anode 80 are provided in the same layer and formed by the same patterning process. In this way, the anode material layer 40 of the pad 100 may be formed without adding process steps or increasing the cost.

According to another embodiment of this disclosure, the display area further comprises a transistor such as TFT, and the transistor comprises a source electrode 94/drain electrode 96. The metal layer 30 of the pad 100 and the source electrode 94/drain electrode 96 of the display area are provided in the same layer and formed by the same patterning process. In this way, the metal layer 30 of the pad 100 may be formed without adding process steps or increasing the cost.

According to another embodiment of this disclosure, the method for producing a display substrate may further comprise: forming an anisotropic conductive adhesive 60 comprising gold beads 65 on the second metal sublayer 36 after removing the photoresist on the side surface of the metal layer 30.

The pad 100 of this disclosure may be used to be connected to an integrated circuit board or a flexible printed circuit board by an anisotropic conductive adhesive 60, for example electrically connected to a pad 150 of an integrated circuit board or a flexible printed circuit board.

The display apparatus of this disclosure may comprise the display substrate of this disclosure.

The display substrate of this disclosure may comprise an active-matrix light-emitting substrate or a passive-matrix light-emitting substrate. The display apparatus of this disclosure may comprise an active-matrix light-emitting display apparatus and a passive-matrix light-emitting display apparatus.

By using the display substrate, the production method thereof, and the display apparatus of this disclosure, the undercutting of the intermediate first metal sublayer such as the aluminum layer 34 may be prevented without adding process steps or increasing the cost, so as to prevent problem that the upper second metal sublayer such as the second titanium layer 36 collapses in following processes and becomes mobile conductive particles which leads to short circuit occurred between different signal lines.

In the case that the metal layer 30 is a multilayer structure comprising a first titanium layer 32, an aluminum layer 34, and a second titanium layer 36, the undercutting of the intermediate aluminum layer 34 may be prevented, by using the display substrate, the production method thereof, and the display apparatus of this disclosure, so as to prevent problem that the second titanium layer 36 collapses in following processes and becomes mobile conductive particles which leads to short circuit occurred between different signal lines.

Furthermore, the conductive material layer 40 such as the anode conductive material 40 covering the side surface of the metal layer 30 also belongs to a conductive contact area, and may further improve the conductivity of the metal layer 30.

The undercutting of the first metal sublayer such as the aluminum layer with a relatively weak corrosion resistance may be prevented, by using the display substrate, the production method thereof, and the display apparatus of this disclosure, so as to prevent problem that the second metal sublayer with a relatively strong corrosion resistance, such as a titanium layer, collapses in following processes and becomes mobile conductive particles which leads to short circuit occurred between different signal lines. In some examples, the production method of the display substrate of this disclosure will not add process steps or increase the cost.

In the case that the metal layer is a multilayer structure comprising a titanium layer, an aluminum layer, and a titanium layer, the undercutting of the intermediate aluminum layer may be prevented, by using the display substrate, the production method thereof, and the display apparatus of this disclosure, so as to prevent problem that the upper titanium layer collapses in following processes and becomes mobile conductive particles which leads to short circuit occurred between different signal lines.

Furthermore, the conductive material layer covering the side surface of the metal layer also belongs to a conductive contact area, and may further improve the conductivity of the metal layer.

Obviously, various modifications and variations may be made to the examples of this disclosure by the person skilled in the art without deviating from the spirit and the scope of this disclosure. Thus, if these modifications and variations of this disclosure are within the scope of the claims of this disclosure and equivalent techniques thereof, this disclosure also intends to encompass these modifications and variations.

What is claimed is:

1. A method for producing a display substrate comprising a display area and a pad area outside the display area, wherein the method comprises the steps of:

forming a metal layer on the pad area, which comprises a first metal sublayer and a second metal sublayer laminated on the first metal sublayer, wherein a corrosion resistance of the second metal sublayer is stronger than that of the first metal sublayer; and forming a conductive material layer, which covers a side surface of the metal layer, wherein forming the conductive material layer comprises:

forming a pre-formed conductive material layer, which at least covers a top surface and a side surface of the metal layer;

coating a photoresist on the pre-formed conductive material layer;

performing exposure and development on the photoresist with a mask to uncover a part of the pre-formed conductive material layer, wherein after development the photoresist of the pre-formed conductive material layer covering the side surface of the metal layer is at least retained, and the photoresist of the pre-formed conductive material layer covering a part of the top surface of the metal layer is at least removed;

etching the part of the pre-formed conductive material layer that has been uncovered; and removing the remaining photoresist.

2. The method according to claim 1, further comprising the step of:

further retaining the photoresist covering a part of the pre-formed conductive material layer in the display area after the development, so as to form a display electrode in the part of the pre-formed conductive material layer in the display area after removing the remaining photoresist.

3. The method according to claim 2, wherein the display electrode comprises an anode, and the conductive material layer of the pad area and the anode of the display area are formed simultaneously.

4. The method according to claim 1, wherein the display area further comprises a source electrode and a drain electrode, and the metal layer of the pad area and the source electrode and drain electrode of the display area are formed simultaneously.

5. The method according to claim 1, further comprising: forming an anisotropic conductive adhesive comprising gold beads on the second metal sublayer after etching the part of the pre-formed conductive material layer that has been uncovered.

* * * * *